(12) United States Patent  
Song

(10) Patent No.: US 6,304,102 B1  
(45) Date of Patent: Oct. 16, 2001

(54) REPAIRABLE DYNAMIC PROGRAMMABLE LOGIC ARRAY

(75) Inventor: Seungyoon P. Song, Palo Alto, CA (US)

(73) Assignee: Elan Research, Palo Alto, CA (US)

( * ) Notice: Subject to any disclaimer, the term of this patent is extended or adjusted under 35 U.S.C. 154(b) by 0 days.

(21) Appl. No.: 09/661,137

(22) Filed: Sep. 13, 2000

(51) Int. Cl.$^7$ .................................................. H01L 25/00
(52) U.S. Cl. ............................................... 326/41; 326/47
(58) Field of Search ................................. 321/37–41, 44, 321/45, 47, 93, 95, 98

(56) References Cited

U.S. PATENT DOCUMENTS

| | | | |
|---|---|---|---|
| 4,769,562 | * | 9/1988 | Ghisio .................................. 307/469 |
| 5,287,017 | * | 2/1994 | Narasimhan et al. ............... 307/465 |
| 6,229,338 | * | 5/2001 | Coulman et al. ...................... 326/41 |

* cited by examiner

*Primary Examiner*—Michael Tokar  
*Assistant Examiner*—Vibol Tan  
(74) *Attorney, Agent, or Firm*—Sawyer Law Group LLP

(57) ABSTRACT

A repairable dynamic programmable logic array (DPLA) is disclosed. The repairable DPLA comprises of AND and OR logic planes and redundant term generators in the logic planes. A redundant term generator comprises a plurality of reprogrammable evaluate modules so that each input to the logic plane can be programmed to affect the redundant term generator. For repairing a defective AND term generator, a redundant output select module connected to the output of the redundant AND term generator is added to each of the OR term generators, including the redundant OR term generators. To repair a defective AND term generator, the wired-NOR function programmed into the defective AND term generator is programmed into the redundant AND term generator. The redundant output select module is programmed to be affected by the redundant AND term output if the associated OR term generator is programmed to be affected by the defective AND term generator. The defective AND term generator is disabled by not enabling its discharge transistor. The redundant AND term generator is enabled by enabling its discharge transistor during evaluate phases. For repairing a defective OR term generator, an output replacement module is added between the OR term generator outputs and the PLA outputs. To repair a defective OR term generator, the wired-NOR function programmed into the defective OR term generator is programmed into the redundant OR term generator. The output replacement module is configured to steer the redundant OR term output to the PLA output that is connected to the defective OR term output. The defective OR term generator is disabled by not enabling its discharge transistor. The redundant OR term generator is enabled by enabling its discharge transistor during evaluate phases.

21 Claims, 8 Drawing Sheets

REPAIRABLE DYNAMIC PROGRAMMABLE LOGIC ARRAY

FIELD OF THE INVENTION

The present invention relates generally to dynamic programmable logic arrays (DPLAs) and specifically to a DPLA that is repairable.

BACKGROUND OF THE INVENTION

A PLA (programmable logic array) produces a predetermined set of outputs for a given set of inputs. Each output is a sum-of-products of a subset of the inputs, implemented using an AND plane to generate the product terms and an OR plane to generate the sums of the product terms. A dynamic PLA implements the sum-of-products functions by precharging and conditionally discharging wired-NOR circuits that are built within the AND and OR arrays. These functions are programmed when a dynamic PLA is built such that the array can only produce the same set of output signals for a given set of input signals. A dynamic PLA is "programmable" only in the sense that it is easy to implement desired functions within the array when the array is built but not in the sense that the array can be programmed to provide different functions once the array is built.

Dynamic programmable logic arrays (DPLAs) are utilized extensively. As shown in FIG. 1, a DPLA 5 includes input signals 2 to an AND plane 10 whose outputs 18 are then the inputs to an OR plane 14 that produces the output signals 20. The outputs of the AND plane 10 are known as AND term signals (Al to Am). The outputs of the OR plane are known as OR term signals (O1 to On). FIG. 1 shows k number of inputs, m number of AND term signals, and n number of OR term signals. The AND plane 10 further comprises multiple nor term generators 12, each of which outputs a wired-NOR signal 18 that is first precharged to Vcc (the supply voltage) and then conditionally discharged to GND (the ground voltage). The Vcc and GND can represent high (TRUE) and low (FALSE) logic states, respectively. Similarly, the OR plane 14 also comprises multiple NOR term generators 16, each of which outputs a wired-NOR signal 20 that is first charged to high logic level and then conditionally discharged to low logic level. For simplicity, the clocks that control the precharge and discharge are not shown in FIG. 1.

FIG. 2 shows two NOR term generators 12 in the AND plane. The wired-NOR signal 30 is discharged if one or more input signals 2 that are "programmed" to affect this output signal are high. An input signal 2 is programmed to affect an output signal by providing an evaluate circuitry 32 controlled by the input signal 2. FIG. 2 shows that the input signals I1 and I2 are programmed to affect the AND term signals Al and A2. If the evaluate circuitry labeled 34 were not provided, for example, then the input signal I1 cannot affect the AND term signal Al while it still affects the AND term signal A2.

FIG. 3 shows a conventional evaluate circuitry 38 for DPLA and the precharge transistor 40 and the discharge transistor 42 for the AND term signal. This precharge and conditional discharge circuitry is controlled in two non-overlapping phases, known as precharge and evaluate. During the precharge phase, both CLKP and CLKD are held low so that precharge transistor 40 is turned on and the discharge transistor 42 is turned off, forcing the output signal NL to be high. During the evaluate phase, both CLKP and CLKD are held high so that the precharge transistor 40 is turned off and the discharge transistor 42 is turned on. During the evaluate phase, if the input signal 46 is high to turn on the evaluate transistor 44, then the charge stored at the output signal NL is discharged via the transistors 44 and 42, resulting in the signal NL being low. If on the other hand, if the input signal 46 is low during the evaluate phase, the evaluate transistor 44 is turned off and the charge stored at the output signal NL remains high. The input signal 46 must not change during the evaluate phase to avoid falsely discharging the output signal NL.

A NOR term generator 12, which comprises one precharge transistor and one discharge transistor and at least one evaluate circuitry, works as follows. During the precharge phase, the precharge transistor 40 is turned on and the discharge transistor 42 is turned off, forcing the output signal NL to be high. During the evaluate phase, the precharge transistor 40 is turned off and the discharge transistor 42 is turned on. During the evaluate phase, if one or more input signals that are programmed to affect this output are high, the charge stored at the output signal NL is discharged and NL becomes low. If none of the input signals are high, then there is no path for the charge stored at NL to be discharged and the NL remains high. The NOR term generators 16 in the OR plane 14 works as same as those in the AND plane 10.

A detailed description of DPLA can be found in "Principles of C-MOS VLSI Design" is by N. H. Weste and K. Eshraghian, Addison-Wesley, $2^{nd}$ Edition, 1993, Chapter 8, pages 592–602 or in the U.S. Pat. No. 4,769,562.

Accordingly, a DPLA produces a predetermined set of outputs for a given set of inputs. Each output is a sum-of-products of a subset of the inputs. The DPLA implements the sum-of-products functions by precharging and discharging wired-NOR circuits that are built within the array. These functions are programmed when a dynamic PLA is built such that the array can only produce the same set of output signals for a given set of input signals. A dynamic PLA is "programmable" only in the sense that it is easy to implement desired functions within the array when the array is built but not in the sense that the array can be programmed to provide different functions once the array is built. Therefore, if a different function is desired the DPLA is inflexible and must be replaced after being programmed.

U.S. patent application Ser. No. 09/609,490 entitled "Dynamic Programmable Logic Array that can be Reprogrammed and a Method of Use" describes a reprogrammable DPLA. This type of DPLA allows for the DPLA to be reprogrammed after a unit is built. However, DPLAs like any other circuit structure may still have defects. If a defect occurs, then the DPLA typically must be discarded.

A DPLA can be made repairable by adding redundant circuit elements and a way to functionally replace a defective element with a non-defective redundant element. There are many ways to implement this replacement operation, but they all involve adding multiplexors to steer the input and output signals between circuit elements, since a defective and its replacement element cannot be moved physically. This replacement operation involves several steps. First, the inputs to the defective element are steered to the replacement element, typically using a multiplexor at the input to the redundant element to select the needed input signals. Second, the same logic function that is implemented in the defective element is implemented in the replacement element. Third, the outputs of the replacement element are steered to the outputs of the defective element and the defective element is made non-functional so that its defective outputs do not affect the replacement outputs. The third step typically uses a multiplexor to select the replacement outputs and deselect the defective outputs. Accordingly, these additional multiplexors add cost and complexity to the DPLA. It is known that for a DPLA, it is important to minimize the number of additional circuits required for implementation of redundancy to minimize the costs associated with their repair.

Accordingly, what is needed is a system and method for allowing a DPLA to be repairable without the additional costs associated with adding multiplexor circuits. The present invention addresses such a need.

SUMMARY OF THE INVENTION

A repairable dynamic programmable logic array (DPLA) is disclosed. The repairable DPLA comprises of AND and OR logic planes and redundant term generators in the logic planes. A redundant term generator comprises a plurality of reprogrammable evaluate modules so that each input to the logic plane can be programmed to affect the redundant term generator. For repairing a defective AND term generator, a redundant output select module connected to the output of the redundant AND term generator is added to each of the OR term generators, including the redundant OR term generators. To repair a defective AND term generator, the wired-NOR function programmed into the defective AND term generator is programmed into the redundant AND term generator. The redundant output select module is programmed to be affected by the redundant AND term output if the associated OR term generator is programmed to be affected by the defective AND term generator. The defective AND term generator is disabled by not enabling its discharge transistor. The redundant AND term generator is enabled by enabling its discharge transistor during evaluate phases. For repairing a defective OR term generator, an output replacement module is added between the OR term generator outputs and the PLA outputs. To repair a defective OR term generator, the wired-NOR function programmed into the defective OR term generator is programmed into the redundant OR term generator. The output replacement module is configured to steer the redundant OR term output to the PLA output that is connected to the defective OR term output. The defective OR term generator is disabled by not enabling its discharge transistor. The redundant OR term generator is enabled by enabling its discharge transistor during evaluate phases.

DETAILED DESCRIPTION

The present invention relates generally to dynamic programmable logic arrays (DPLAs) and specifically to a DPLA that is repairable. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Repairable Dynamic PLA Description

Figure 1:
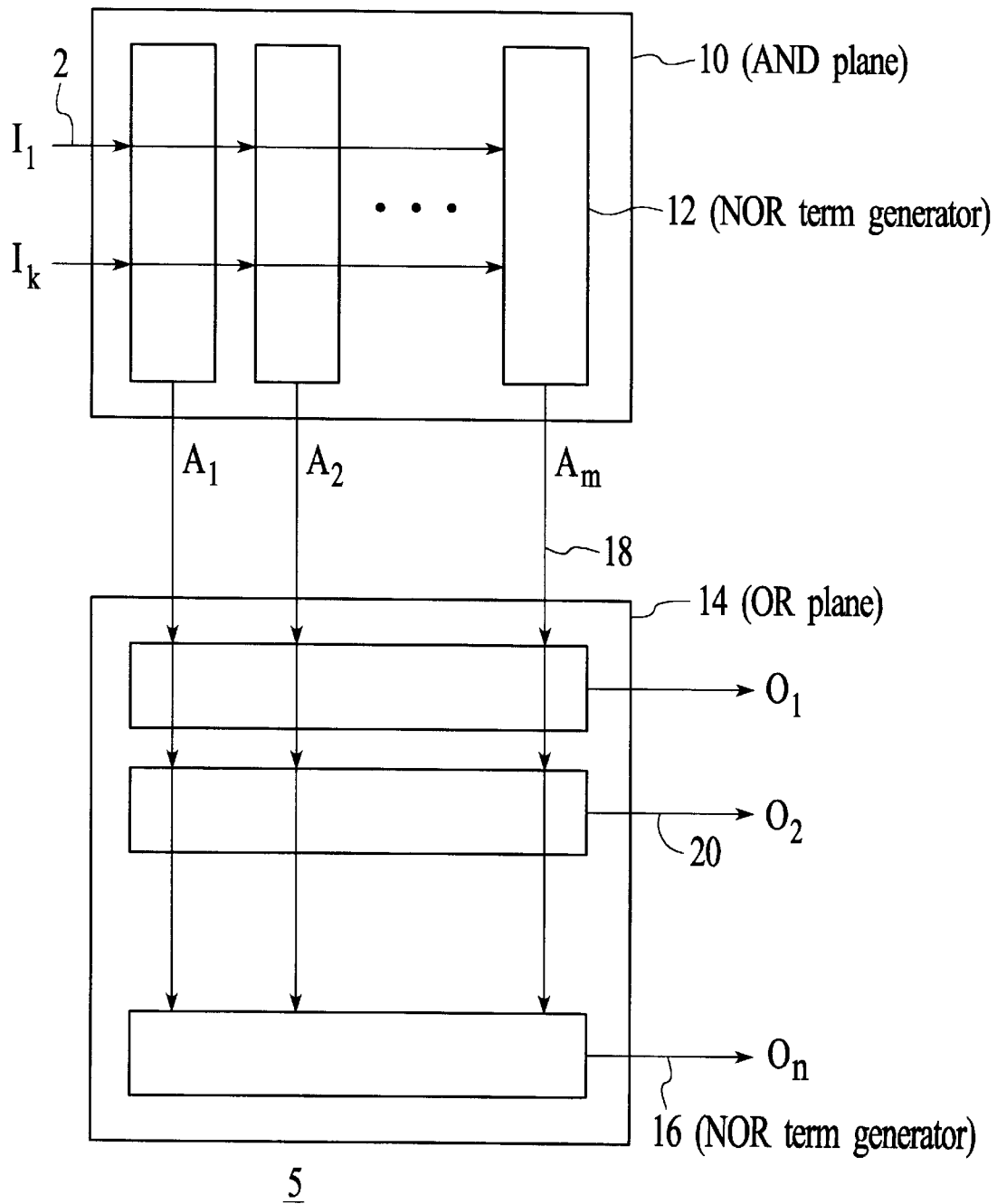
FIG. 1 shows a conventional dynamic programmable logic array (DPLA).
Figure 2:
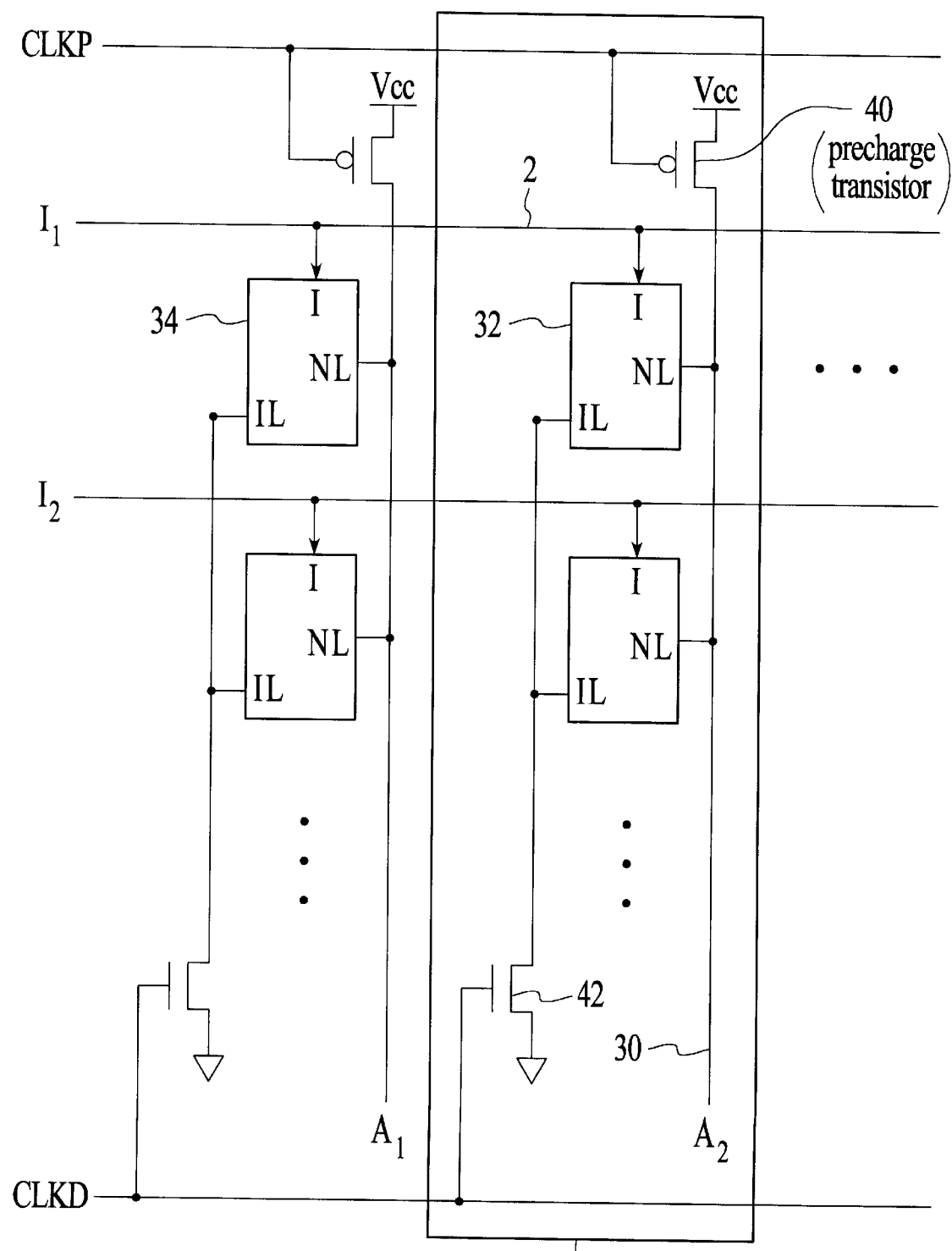
FIG. 2 shows two NOR term generators in the AND plane.
Figure 3:
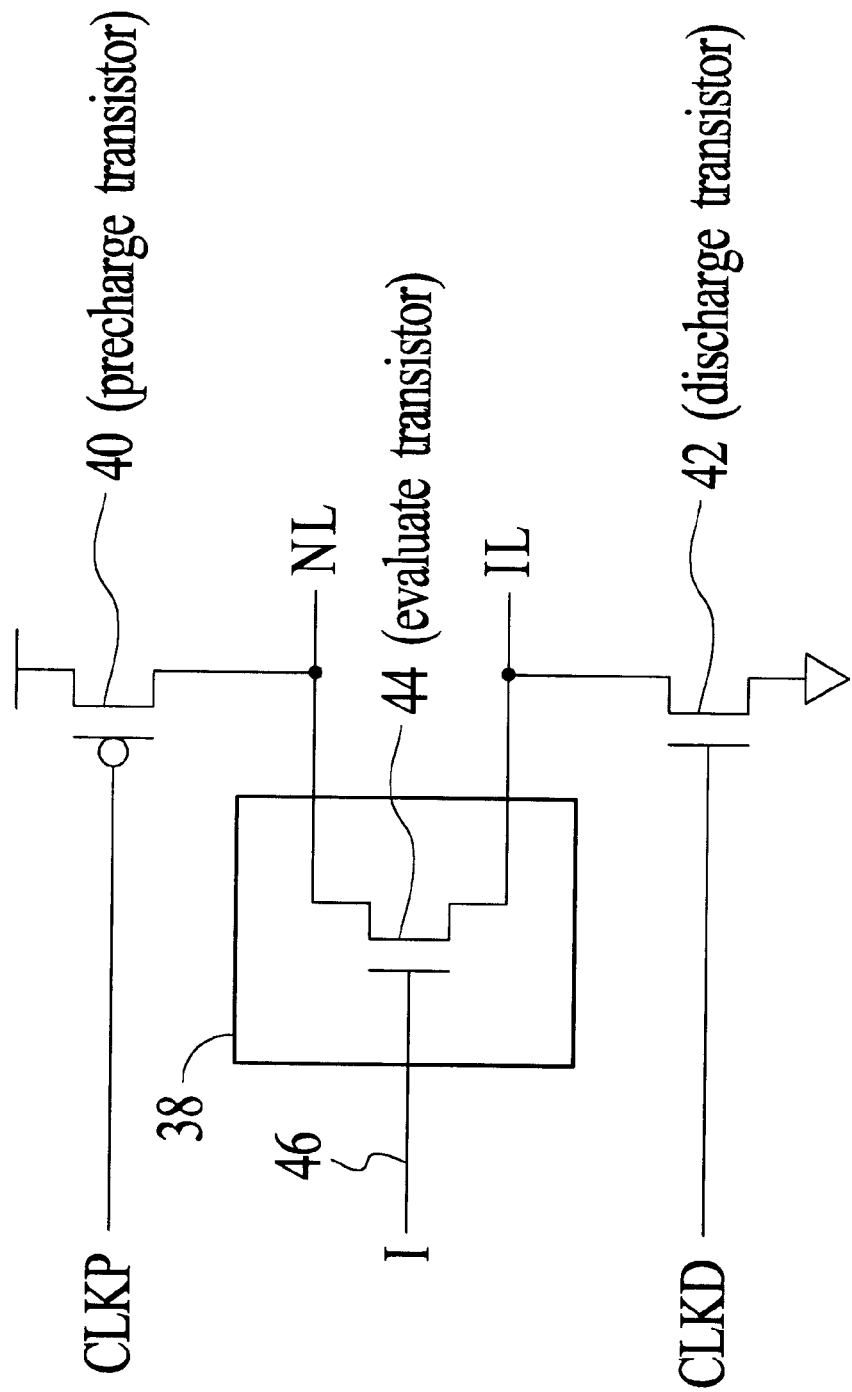
FIG. 3 shows a conventional evaluate circuitry for PDLA and the precharge transistor and the discharge transistor for the AND term signal.
Figure 4:
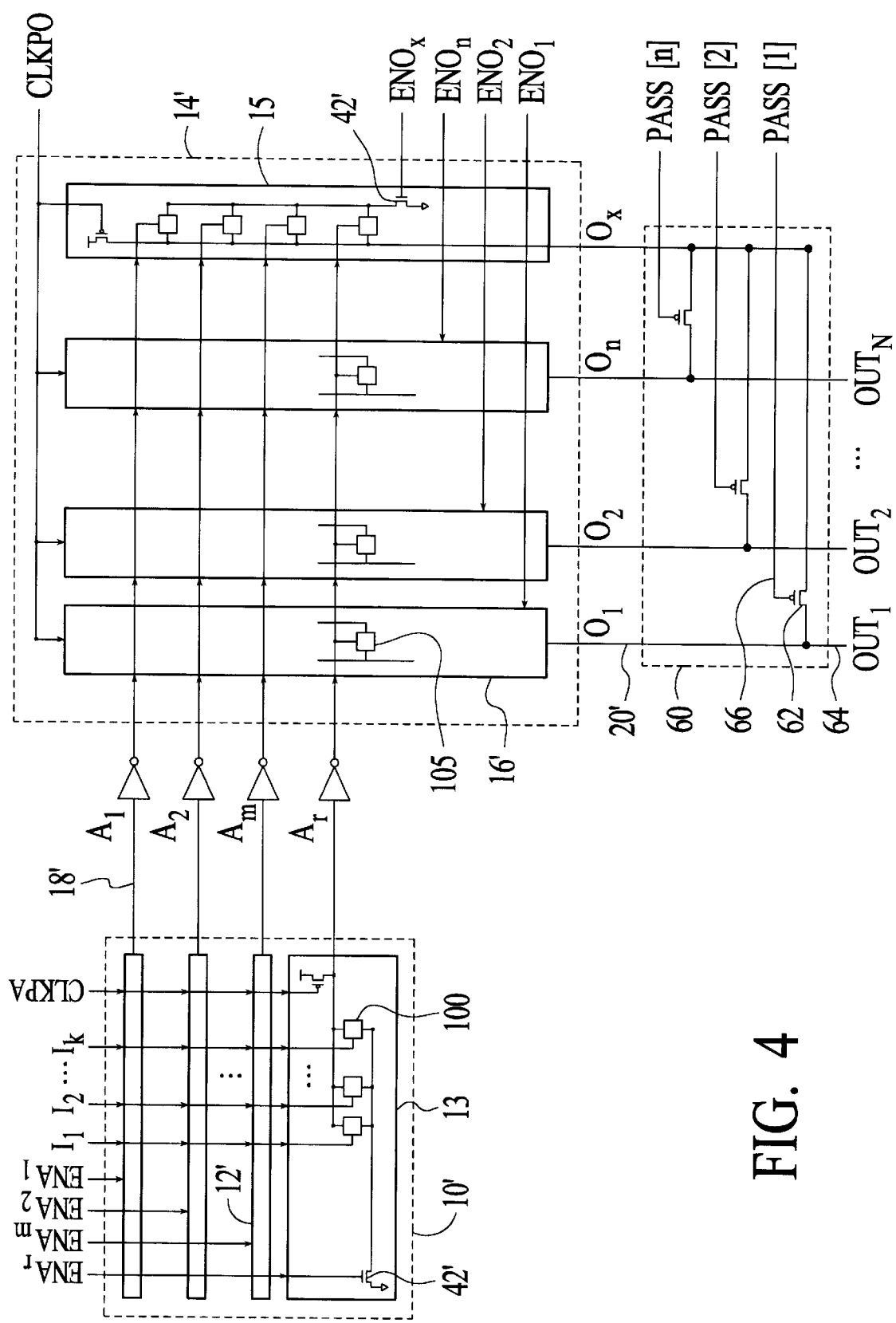
FIG. 4 shows a repairable DPLA in accordance with the present invention.

A dynamic PLA can be made repairable by adding these components, as shown in FIG. 4.

A plurality of redundant AND term generators 13 is provided in the AND plane 10'. Every evaluate module 100 in the redundant generators should either be reprogrammable, as described in the U.S. applications, Ser. No. 09/609,490, entitled "Dynamic Programmable Logic Array that can be Reprogrammed and a Method of Use" filed on Jul. 5, 2000, or configurable, as described in U.S. patent application, Ser. No. 09/640,486, entitled "Configurable Dynamic Programmable Logic Array" and filed on Aug. 16, 2000; both of which are assigned to the assignee of the present application. In so doing, every input to the AND plane can be reprogrammed to affect every redundant AND term. FIG. 4 shows one redundant AND term generator 13 that produces the output Ar.

Similarly, a plurality of redundant OR term generators 15 are added in the OR plane 14' using reprogrammable evaluate modules so that every AND term output 18'—including the redundant AND term outputs—from the AND plane can be reprogrammed to affect every redundant OR term Ox. FIG. 4 shows one redundant OR term generator 15 that produces the output Ox.

Every discharge transistor 42' in the AND and OR planes is made individually controllable by providing a separate enable signal. There are M+1 of these enable signals ENA to control the M number of AND term generators and one redundant AND term generator and N+1 of these enable signals ENO to control the N number of OR term generators and one redundant OR term generator in FIG. 4.

For each redundant OR term generator, a pass transistor 62 is added with individual enable signal 66 to connect the redundant OR term output Ox to each of the PLA outputs 64. These are collectively known as the output replacement module 60. FIG. 4 shows only one redundant OR term output Ox and one output replacement module 60.

There are two alternatives to steer the redundant AND term output to the OR term generators. The first is to use an output replacement module that is structurally identical to the one used after the OR plane. This module would have a pass transistor with individual enable signal to connect the redundant AND term output Ar to each non-redundant output of the AND plane. The alternative is to add a reprogrammable evaluate module 105 (known as redundant output select module) to each of the OR term generators 16' so that the redundant AND term output can be programmed to affect every OR term generator, as shown in FIG. 4. One of ordinary skill in the art recognizes there could be any number of redundant outputs and their use would be within the spirit and scope of the present invention.

Figure 5:
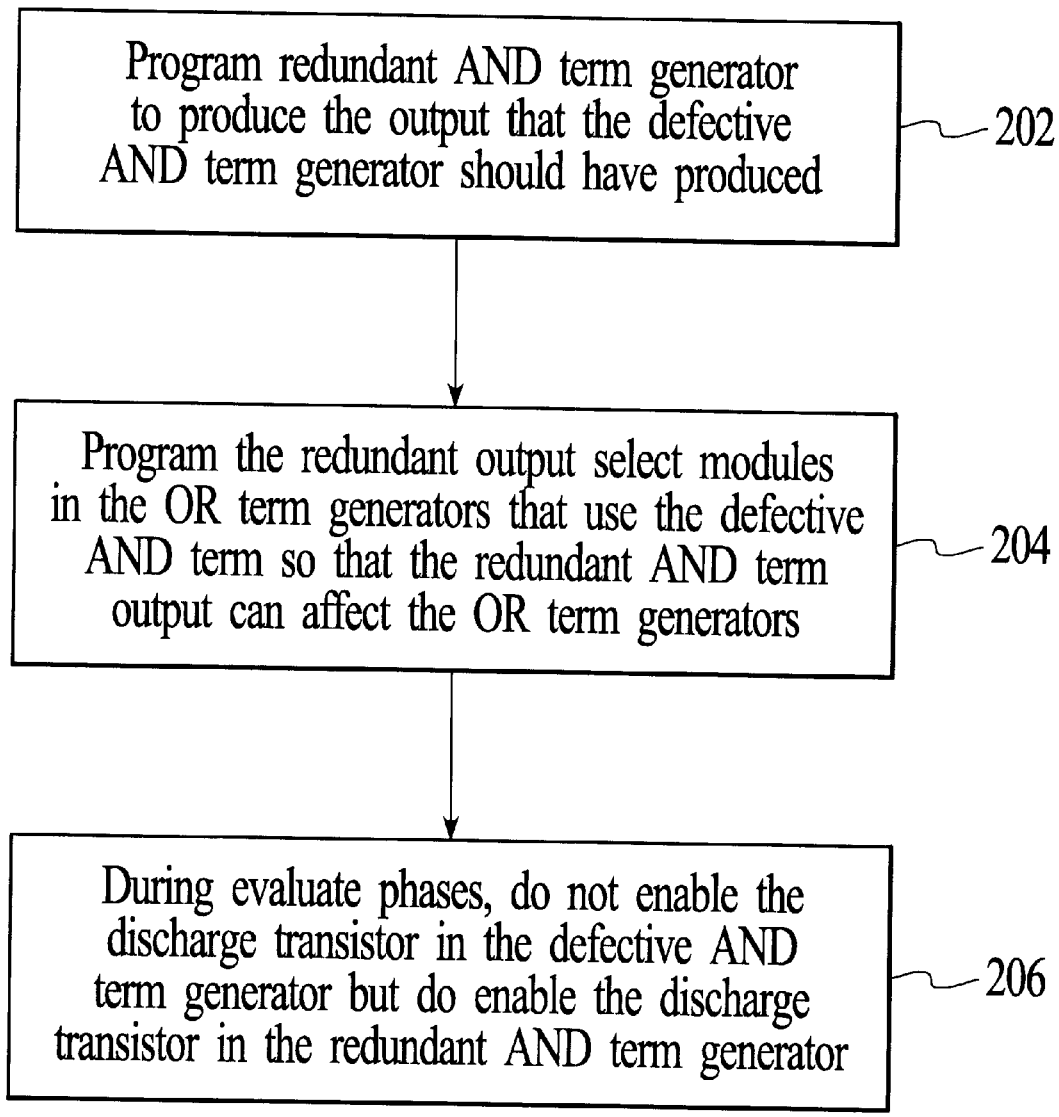
FIG. 5 is a flow chart illustrating repairing a defective AND term generator.

Repairing a defective AND term generator is now described. FIG. 5 is a flow chart illustrating the repair of a defective AND term generator. When an AND term generator is found to be defective, the wired-NOR function programmed into the defective generator is reprogrammed into a redundant AND term generator, via step 202. For example, if the generator that produces A1 is defective and if the inputs I1 and I3 are to affect A1, then the redundant AND term generator that produces Ar is reprogrammed to be affected by the inputs I1 and I3.

This solves the problem of generating the output that the defective AND term generator would have generated. This output must now be steered to all of the OR term generators that use it, using the redundant output select module 105 that is in every OR term generator, via step 204. If an OR term is programmed to be affected by the defective AND term output, its redundant output select module 105 is reprogrammed to be affected by the replacement AND term output. This completes all but one of the replacement operation—de-selecting the defective AND term output so that it doesn't affect the replacement output, via step 206.

This is accomplished by not enabling the discharge transistor 42' in the defective AND term generator during the evaluate phase, which leaves the defective AND term output to be at the precharged level and does not cause the OR term generators that use the output to be falsely discharged. On the other hand, the discharge transistor in the replacement AND term generator must be enabled during the evaluate phase so that the desired AND term value can be generated by the redundant AND term generator. There can be many mechanisms to determine which generators are defective and to control each AND term generator individually—a discussion of their details is not important for proper understanding of this disclosure.

Figure 6:
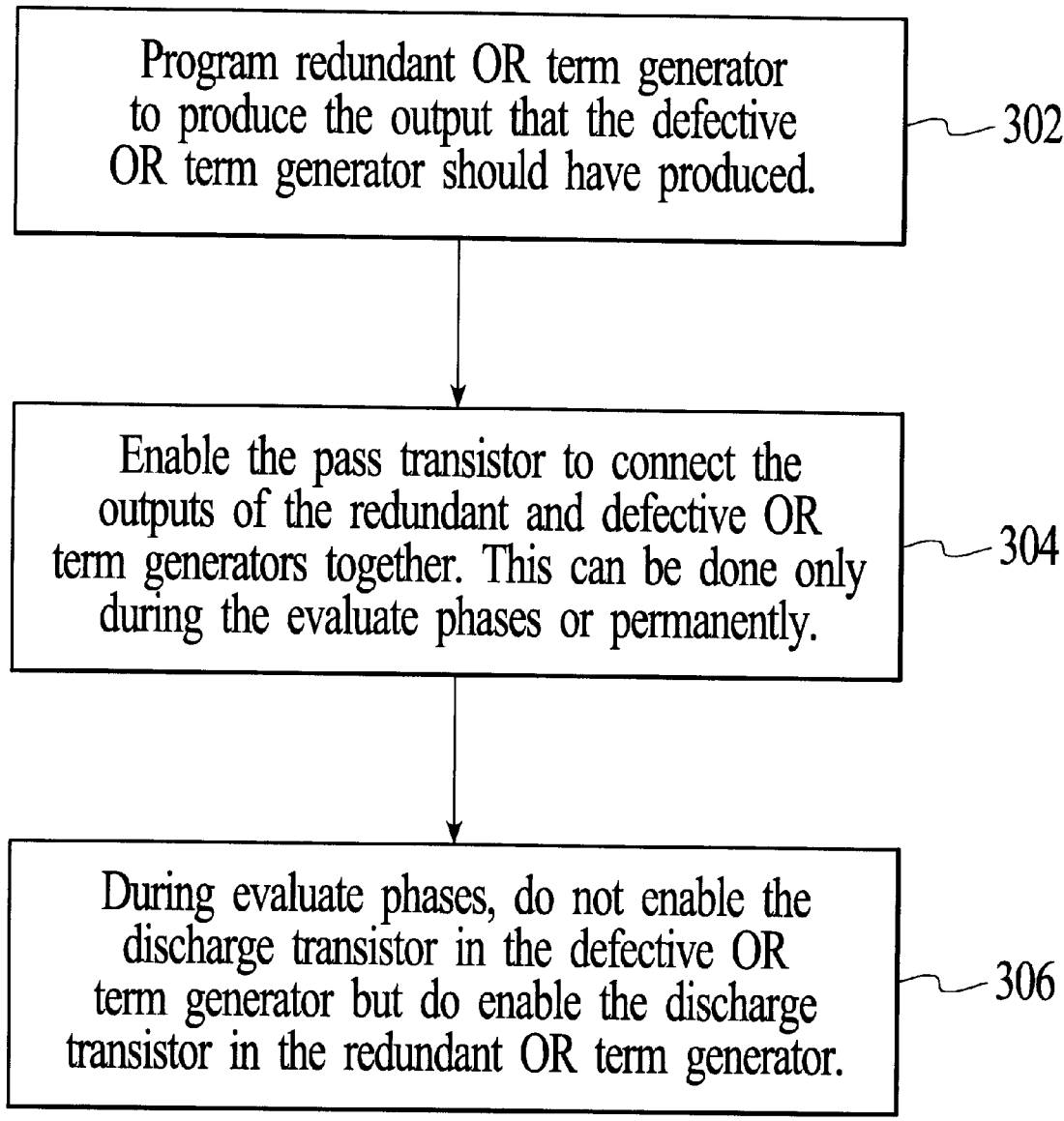
FIG. 6 is a flow chart illustrating repairing a defective OR term generator.

Repairing a defective OR term generator is quite similar to repairing a defective AND term generator. FIG. 6 is a flow chart illustrating repairing a defective OR term generator. When an OR term generator is found to be defective, the wired-NOR function programmed into the defective generator is reprogrammed into the replacement OR term generator, via step 302. For example, if the OR term generator that produces O1 is defective and if the inputs I3 and I4 are programmed to affect O1, then the redundant OR term generator Ox is programmed to be affected by the inputs I3 and I4. To steer the replacement OR term output Ox to the PLA output OUT1, the pass transistor 62 that connects Ox to OUT1 is enabled permanently or only during the evaluate phases, via step 304. During the evaluate phase, the discharge transistor 42' in the replacement OR term generator Ox is enabled, via step 306, rather than the defective OR term generator, producing the desired output value at Ox and leaving the state of O1 at the precharged level. Since the pass transistor that connects O1 and Ox is enabled, however, the state of O1 becomes that of Ox—it either remains in the precharged level if Ox is at the precharged level or changes to the discharged level if Ox is at the discharged level. The defective OR term generator is effectively replaced with the redundant OR term generator whose output is routed to the PLA output.

The output replacement module 60 can use a number of different pass transistors, of which only the simplest version is shown in FIG. 4. In this arrangement, the enable signals (ENO) that control the discharge transistors can also be used as the pass transistor control (PASS) signals. That is, PASS [1] can be connected to ENO1, PASS [2] to ENO2. If the PLA outputs are used as inputs to another wired-NOR logic plane, then the redundant output select modules can be embedded in the logic plane instead of using an output replacement module between the two logic planes. Similarly, if an output replacement module is used instead of the redundant output select modules for steering the redundant AND term output, then the enable signals (ENA) that control the discharge transistors in the AND plane can also be used as the pass transistor control signals.

Figure 7:
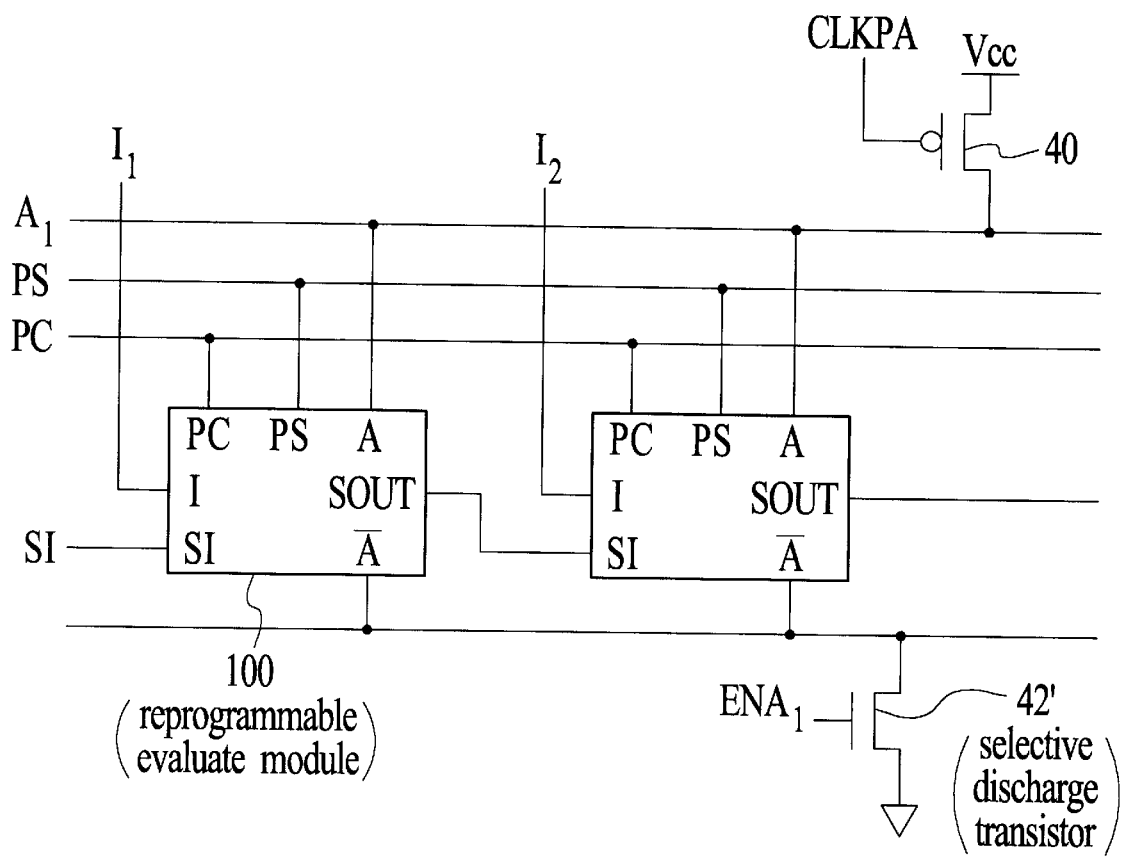
FIG. 7 shows a redundant NOR term generator with two scan-based reprogrammable evaluate modules.
Figure 8:
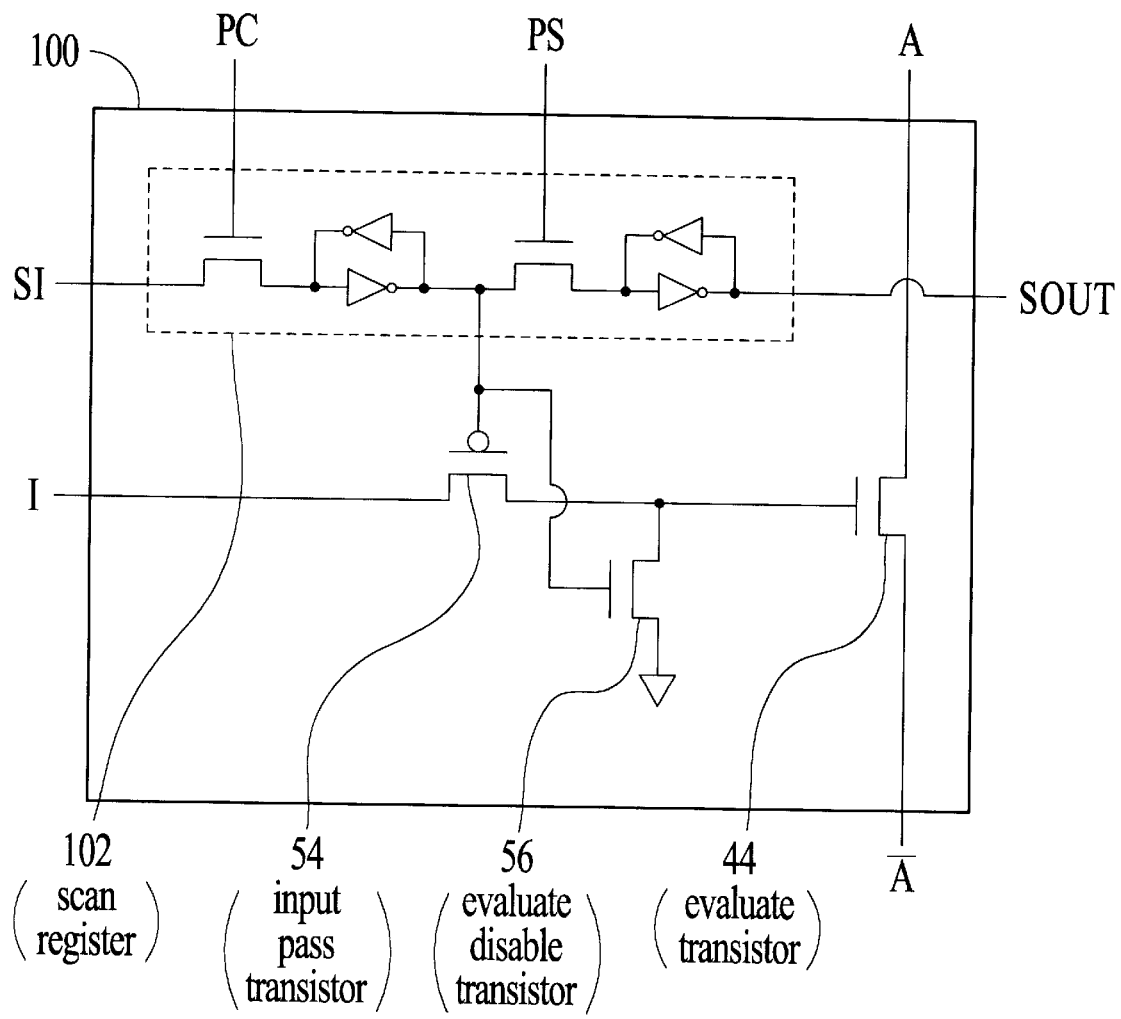
FIG. 8 shows a scan-based reprogrammable evaluate module.

Preferred Embodiment of Reprogrammable Evaluate Modules in the Redundant Generator It is most economical to connect all of the reprogrammable evaluate modules used in the redundant generators in one scan chain and program all of them serially. FIG. 7 shows a connection between two scan-based reprogrammable evaluate modules 100, indicating that the output of one scan register SOUT is connected to the scan register input SIN of an adjacent module and that both modules share the same scan clocks PC and PS. FIG. 8 shows a scan register 102 inside a scan-based reprogrammable evaluate module 100. It is well known in the art that, to write a desired value into a scan register, the desired value is placed at the scan register input SIN and the PC is asserted high and then low followed by the PS being asserted high and then low. This sequence of asserting the two scan clocks in a non-overlapped manner moves the data at the input SIN to the output SOUT. By repeating this sequence, all scan registers in one scan chain can be written with the desired data. To avoid falsely discharging the evaluate transistors, the scan registers must not be programmed during an evaluate phase.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A dynamic programmable logic array (DPLA) comprising:

at least one logic plane, the at least one logic plane including a plurality of term generators, at least one redundant term generator, a plurality of inputs and a plurality of enable signals;

an output replacement module coupled to the outputs of the plurality of term generators and the output of the at least one redundant term generator and for providing outputs; and a select signal coupled to the output replacement module.

2. The DPLA of claim 1 in which each of the plurality of term generators comprises a precharge transistor, a discharge transistor and a plurality of evaluate transistors coupled to the precharge transistor and the discharge transistor.

3. The DPLA of claim 2 in which the at least one redundant term generator comprises a precharge transistor, a discharge transistor and a plurality of reprogrammable evaluate modules coupled to the precharge and discharge transistor wherein each reprogrammable evaluate module is coupled to each of the plurality of inputs.

4. The DPLA of claim 3 in which each of the plurality of enable signals is coupled to the discharge transistor in each of the plurality of term generators and the at least one redundant term generator.

5. The DPLA of claim 4 in which one of the plurality of term generators is defective and the wired-NOR function programmed into the defective term generator is programmed into the at least one redundant term generator.

6. The DPLA of claim 5 in which the enable signal coupled to the defective term generator is not asserted during the evaluate phases but the enable signal coupled to the at least one redundant term generator is asserted during the evaluate phases.

7. The DPLA of claim 6 in which each of the plurality of reprogrammable evaluate modules comprises a programmable storage element, an input pass transistor coupled to the programmable storage element, an evaluate disable transistor and an evaluate transistor coupled to the input pass transistor, wherein the state of the programmable storage element enables the input pass transistor and disables the evaluate disable transistor, allowing the input signal to enable or disable the evaluate transistor, or disables the input pass transistor and enables the evaluate disable transistor, thereby disallowing the input signal to affect the evaluate transistor.

8. The DPLA of claim 7 in which the programmable storage element is a scan register and the plurality of scan registers in the at least one logic plane are connected together to form at least one scan chain.

9. The DPLA of claim 6 in which the output replacement module comprises a plurality of pass transistors wherein each of the plurality of pass transistors connects the output of the at least one redundant term generator to each of the outputs of the plurality of term generators when enabled.

10. The DPLA of term 9 in which the pass transistor that connects the defective term generator and the at least one redundant term generator is enabled permanently.

11. The DPLA of claim 9 in which the pass transistor that connects the defective term generator and the at least one redundant term generator is enabled only during the evaluate phases.

12. A dynamic programmable logic array (DPLA) comprising:
a first logic plane, the first logic plane including a plurality of first term generators, at least one first redundant term generator, a plurality of first inputs and a plurality of first enable signals;
and a second logic plane coupled to the first logic plane, the second logic plane including a plurality of second term generators.

13. The DPLA of claim 12 in which each of the plurality of first term generators comprises a precharge transistor, a discharge transistor and a plurality of evaluate transistors coupled to the precharge transistor and the discharge transistor.

14. The DPLA of claim 13 in which the at least one first redundant term generator comprises a precharge transistor, a discharge transistor and a plurality of first reprogrammable evaluate modules coupled to the precharge and discharge transistors wherein each of first reprogrammable evaluate module is coupled to each of the plurality of first inputs.

15. The DPLA of claim 14 in which each of the plurality of second term generators comprises a precharge transistor, a discharge transistor, a plurality of evaluate transistors and a second reprogrammable evaluate module coupled to precharge and discharge transistors wherein the second reprogrammable evaluate module is coupled to the output of the at least one first redundant term generator.

16. The DPLA of claim 15 in which each of the plurality of first enable signals is coupled to the discharge transistor in each of the plurality of first term generators and at the least one first redundant term generator.

17. The DPLA of claim 16 in which one of the plurality of first term generators is defective and the wired-NOR function programmed into the defective first term generator is programmed into the at least one first redundant term generator.

18. The DPLA of claim 17 in which the first enable signal coupled to the defective first term generator is not asserted during the evaluate phases but the first enable signal coupled to the at least one first redundant term generator is asserted during the evaluate phases.

19. The DPLA of claim 18 in which each of the plurality of first and second reprogrammable evaluate modules comprises a programmable storage element, an input pass transistor coupled to the programmable storage element, an evaluate disable transistor and an evaluate transistor coupled to the input pass transistor, wherein the state of the programmable storage element enables the input pass transistor and disables the evaluate disable transistor, allowing the input signal to enable or disable the evaluate transistor, or disables the input pass transistor and enables the evaluate disable transistor, thereby disallowing the input signal to affect the evaluate transistor.

20. The DPLA of claim 19 in which the programmable storage element is a scan register and the plurality of scan registers in the first and second logic planes are connected together to form at least one scan chain.

21. The DPLA of claim 18 in which the second reprogrammable evaluate module in each of the plurality of second term generators is programmed to allow the output of the at least one first redundant term generator to enable or disable the evaluate transistor if the second term generator is to be affected by the defective first term generator.

* * * * *